US012411479B2

(12) United States Patent
Shoji et al.

(10) Patent No.: US 12,411,479 B2
(45) Date of Patent: Sep. 9, 2025

(54) METHOD AND APPARATUS FOR DETERMINING CAUSE OF ABNORMALITY IN A SEMICONDUCTOR MANUFACTURING CHAMBER

(71) Applicant: Tokyo Electron Limited, Tokyo (JP)

(72) Inventors: Kazushi Shoji, Sapporo (JP); Shintaro Saruwatari, Sapporo (JP); Nobutoshi Terasawa, Sapporo (JP); Motokatsu Miyazaki, Sapporo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 180 days.

(21) Appl. No.: 17/350,444

(22) Filed: Jun. 17, 2021

(65) Prior Publication Data
US 2021/0397169 A1  Dec. 23, 2021

(30) Foreign Application Priority Data

Jun. 23, 2020  (JP) ................................. 2020-107706

(51) Int. Cl.
G05B 19/418 (2006.01)
G05B 23/02 (2006.01)
H01L 21/67 (2006.01)

(52) U.S. Cl.
CPC ... *G05B 19/41875* (2013.01); *G05B 23/0275* (2013.01); *H01L 21/67248* (2013.01);
(Continued)

(58) Field of Classification Search
CPC .......... G05B 19/41875; G05B 19/4603; G05B 23/0275; G05B 23/0283;
(Continued)

(56) References Cited

U.S. PATENT DOCUMENTS 5,132,075 A * 7/1992 Asakura ............... G21C 17/022
376/310
2008/0208385 A1 * 8/2008 Sakamoto ........... C23C 16/4412
700/121
(Continued)

FOREIGN PATENT DOCUMENTS

JP    2008021732 A  * 1/2008
JP    2008-052577 A    3/2008
(Continued)

OTHER PUBLICATIONS

Dunia, Ricardo, S. Joe Qin, Thomas F. Edgar, and Thomas J. McAvoy. "Identification of faulty sensors using principal component analysis." AIChE Journal 42, No. 10 (1996): 2797-2812 (Year: 1996).*

(Continued)

*Primary Examiner* — Douglas Kay
(74) *Attorney, Agent, or Firm* — Venjuris, P.C.

(57) ABSTRACT

An information processing apparatus detects an abnormality sign in a semiconductor manufacturing apparatus. The apparatus includes: a sensor data collector configured to acquire sensor waveform data represented with respect to a sensor value axis and a time axis measured by a semiconductor manufacturing apparatus that is executing a process according to a same recipe; a monitoring band calculator configured to calculate each monitoring band represented with respect to the sensor value axis and the time axis used in a waveform monitoring method from a predetermined number or more of the sensor waveform data; and an abnormality sign detector configured to monitor a waveform of the sensor waveform data using each monitoring band represented with respect to the sensor value axis and the time axis and detect an abnormality sign of the semiconductor manufacturing apparatus.

10 Claims, 13 Drawing Sheets

(52) U.S. Cl.
CPC ............... *H01L 21/67276* (2013.01); *G05B 2219/32368* (2013.01); *G05B 2219/45031* (2013.01)

(58) Field of Classification Search
CPC .......... G05B 2219/32368; G05B 2219/45031; G05B 2219/33285; G05B 23/0216; G05B 23/0235; G05B 23/0267; H01L 21/67248; H01L 21/62276; H01L 21/67253; Y02P 90/02

See application file for complete search history.

(56) References Cited

U.S. PATENT DOCUMENTS

| | | | |
|---|---|---|---|
| 2016/0116892 A1* | 4/2016 | Cheng | G05B 19/048 700/108 |
| 2018/0107637 A1* | 4/2018 | Sugawara | G06F 40/166 |
| 2018/0138096 A1* | 5/2018 | Koyama | G01R 31/26 |
| 2020/0109712 A1* | 4/2020 | Maishigi | F04C 28/28 |
| 2020/0333777 A1* | 10/2020 | Maruyama | G06N 20/10 |

FOREIGN PATENT DOCUMENTS

| | | | | |
|---|---|---|---|---|
| JP | 2009054766 A | * | 3/2009 | |
| WO | WO-2018061842 A1 | * | 4/2018 | ......... G05B 23/0254 |
| WO | WO-2021079472 A1 | * | 4/2021 | ............. G06F 17/15 |

OTHER PUBLICATIONS

Kourti, Theodora, Paul Nomikos, and John F. MacGregor. "Analysis, monitoring and fault diagnosis of batch processes using multiblock and multiway PLS." Journal of process control 5, No. 4 (1995): 277-284 (Year: 1995).*

* cited by examiner

FIG. 9A

LEARN RELATIONSHIP FROM EACH SCORE IN NORMAL RANGE

| Step Sensor | 1 | 2 | 3 | ... | n-1 | n |
|---|---|---|---|---|---|---|
| A | 0.35 | 0.56 | 1.23 | | 0.49 | 0.87 |
| B | 0.53 | 2.22 | 2.12 | | 1.34 | 1.12 |
| C | 0.22 | 0.34 | 0.53 | | 2.45 | 1.29 |
| D | 0.05 | 0.09 | 0.12 | | 0.08 | 0.12 |
| ... | | | | | | |
| Z | 1.30 | 1.02 | 1.03 | | 0.88 | 0.80 |

FIG. 9B

CALCULATE DIFFERENCE OF RELATIONSHIP AT ANY TIME FROM NORMAL TIME
e.g., SENSOR D AND STEPS 2 AND 3 WHICH ARE HIGHLY RELATED TO ABNORMALITY OF SENSOR B AND STEP 3

| Step Sensor | 1 | 2 | 3 | ... | n-1 | n |
|---|---|---|---|---|---|---|
| A | 0.37 | 0.76 | 1.53 | | 0.43 | 0.67 |
| B | 0.63 | 2.82 | 5.72 | | 1.71 | |
| C | 0.28 | 0.54 | 1.18 | | 1.51 | |
| D | 0.12 | 1.16 | 2.21 | | 0.11 | |
| ... | | | | | | |
| Z | 1.55 | 1.28 | 1.32 | | 0.92 | |

| SENSOR × STEP | CONTRIBUTION RATE |
|---|---|
| Sensor-D Step3 | 53.5% |
| Sensor-D Step2 | 23.4% |
| Sensor-A Step3 | 12.3% |
| Sensor-A Step2 | 6.20% |
| Sensor-C Step2 | 4.30% |

FIG. 11

| CORRELATION | A | B | C | D | Z |
|---|---|---|---|---|---|
| A |  | 0.662 | −0.228 | 0.528 | 0.130 |
| B | 0.662 |  | −0.060 | 0.806 | 0.286 |
| C | −0.228 | −0.060 |  | −0.095 | −0.103 |
| D | 0.528 | 0.806 | −0.095 |  | 0.332 |
| Z | 0.130 | 0.286 | −0.103 | 0.332 |  |

METHOD AND APPARATUS FOR DETERMINING CAUSE OF ABNORMALITY IN A SEMICONDUCTOR MANUFACTURING CHAMBER

CROSS-REFERENCE TO RELATED APPLICATION

This application is based on and claims priority from Japanese Patent Application No. 2020-107706 filed on Jun. 23, 2020 with the Japan Patent Office, the disclosure of which is incorporated herein in its entirety by reference.

TECHNICAL FIELD

The present disclosure relates to an information processing apparatus, a monitoring method, and a storage medium storing a program.

BACKGROUND

A method of accurately determining the cause of a pressure abnormality in a processing chamber has been known in the related art (see, e.g., Japanese Patent Laid-Open Publication No. 2008-021732).

In a method of determining the cause of pressure abnormality in the related art, a valve for adjusting the pressure in the processing chamber is controlled to adjust the pressure in the processing chamber to a target value, the valve is closed to start the pressure check, the pressure data in the processing chamber for the predetermined pressure check time is acquired, the waveform indicating the time change of the pressure data is identified, and the cause of the abnormal pressure in the processing chamber is determined based on an analysis of the identified waveform.

SUMMARY

An aspect of the present disclosure relates to an information processing apparatus configured to detect an abnormality sign in a semiconductor manufacturing apparatus. The information processing apparatus includes: a sensor data acquisition unit configured to acquire sensor waveform data represented with respect to a sensor value axis and a time axis measured by the semiconductor manufacturing apparatus that is executing a process according to the same recipe; a monitoring band calculation unit configured to calculate each monitoring band represented with respect to the sensor value axis and the time axis used in a waveform monitoring method from a predetermined number or more of the sensor waveform data; and an abnormality sign detection unit configured to monitor a waveform of the sensor waveform data using each monitoring band represented with respect to the sensor value axis and the time axis and detect an abnormality sign of the semiconductor manufacturing apparatus.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 9A and 9B are image diagrams of an example of a score for each combination of a sensor and a step.

FIG. 11 is an image diagram of an example of a correlation coefficient between sensors.

DETAILED DESCRIPTION

In the following detailed description, reference is made to the accompanying drawing, which form a part thereof. The illustrative embodiments described in the detailed description, drawing, and claims are not meant to be limiting. Other embodiments may be utilized, and other changes may be made without departing from the spirit or scope of the subject matter presented here.

Hereinafter, embodiments for implementing the present disclosure will be described with reference to the accompanying drawings.

<System Configuration>

Figure 1:
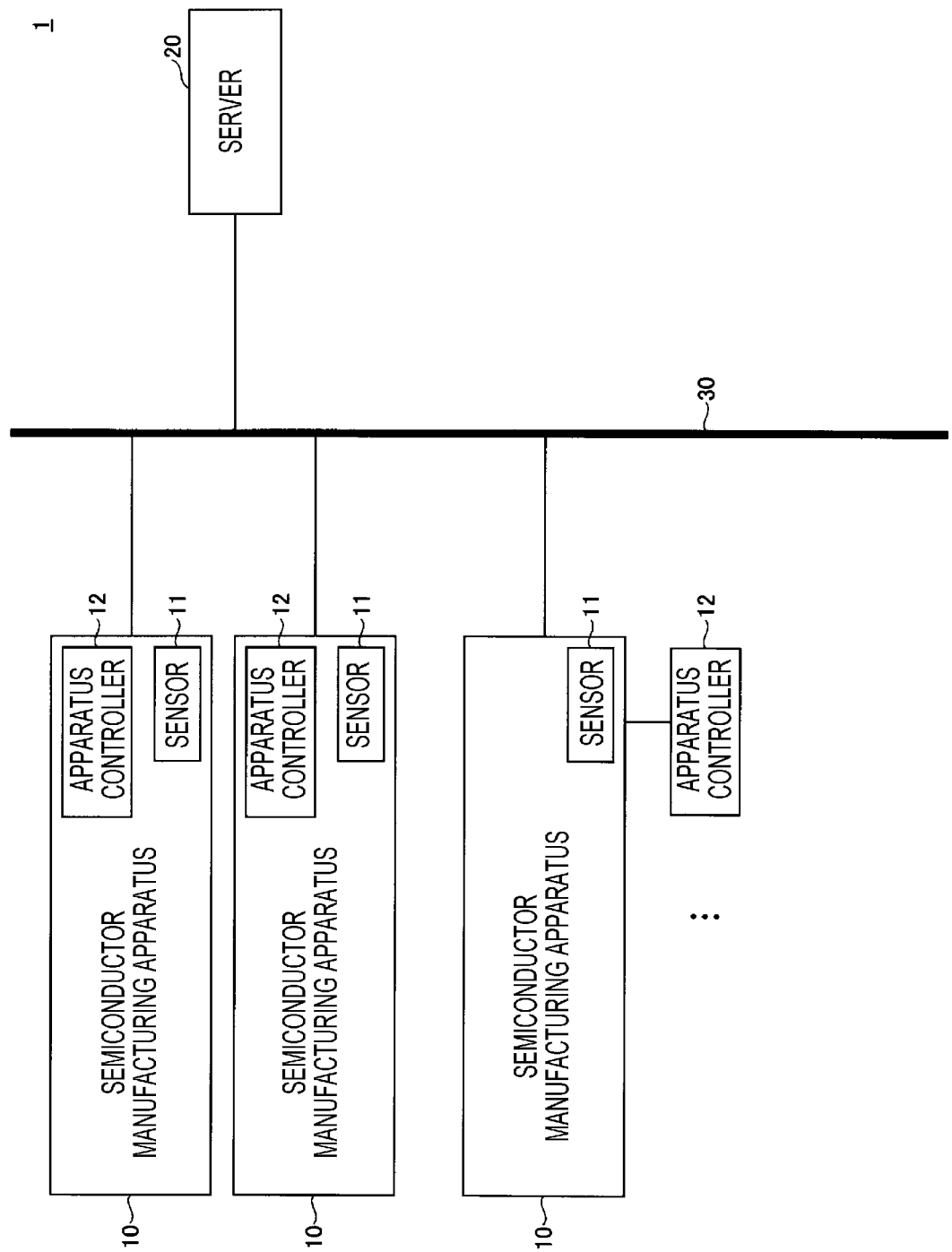
FIG. 1 is a configuration diagram of an example of an information processing system according to the present embodiment.

FIG. 1 is a configuration diagram of an example of an information processing system according to the present embodiment. The information processing system 1 illustrated in FIG. 1 includes a semiconductor manufacturing apparatus 10, a sensor 11, an apparatus controller 12, and a server 20. The semiconductor manufacturing apparatus 10 and the server 20 are communicably connected to each other via a network 30 such as a local area network (LAN).

The semiconductor manufacturing apparatus 10 is, for example, a heat treatment film forming apparatus, and executes a process according to a control command (process parameter) output from the apparatus controller 12. The semiconductor manufacturing apparatus 10 is mounted with a plurality of sensors 11. The sensor 11 measures temperature or pressure, and outputs sensor waveform data described later.

Further, the semiconductor manufacturing apparatus 10 may be mounted with the apparatus controller 12 as illustrated in FIG. 1, or may not necessarily be mounted as long as the semiconductor manufacturing apparatus 10 is communicably connected. The apparatus controller 12 is a controller having a computer configuration for controlling the semiconductor manufacturing apparatus 10. The apparatus controller 12 outputs a process parameter for controlling the control components of the semiconductor manufacturing apparatus 10 to the semiconductor manufacturing apparatus 10 according to the recipe. In addition, the apparatus controller 12 acquires sensor waveform data measured by the sensor 11 of the semiconductor manufacturing apparatus 10 that executes the process according to the recipe.

The recipe of the semiconductor manufacturing apparatus 10 has a control unit called a plurality of steps. The process of the semiconductor manufacturing apparatus 10 includes a plurality of steps. The apparatus controller 12 has a man-machine interface (MMI) function of receiving an instruction to the semiconductor manufacturing apparatus 10 from the operator and providing information on the semiconductor manufacturing apparatus 10 to the operator.

Also, the apparatus controller 12 may have a function of communicating with the apparatus controller 12 for another semiconductor manufacturing apparatus 10. The apparatus controller 12 may have a function of communicating with the apparatus controller 12 for another semiconductor manufacturing apparatus 10 via the server 20. In this way, the apparatus controller 12 may use information on a plurality of semiconductor manufacturing apparatuses 10 (e.g., sensor waveform data for each step when the process is executed according to the same recipe). The server 20 has a function of managing information on a plurality of semiconductor manufacturing apparatuses 10, a function of providing a program executed by the apparatus controller 12 of the semiconductor manufacturing apparatus 10, and a function of managing recipes.

The information processing system 1 in FIG. 1 is an example, and it is needless to say that there are various system configuration examples depending on the application and purpose. For example, the information processing system 1 may have various configurations such as a configuration in which the apparatus controller 12 of each semiconductor manufacturing apparatus 10 is integrated into an apparatus controller for a plurality of semiconductor manufacturing apparatuses 10, or a configuration in which the apparatus controller 12 is further divided.

<Hardware Configuration>

Figure 2:
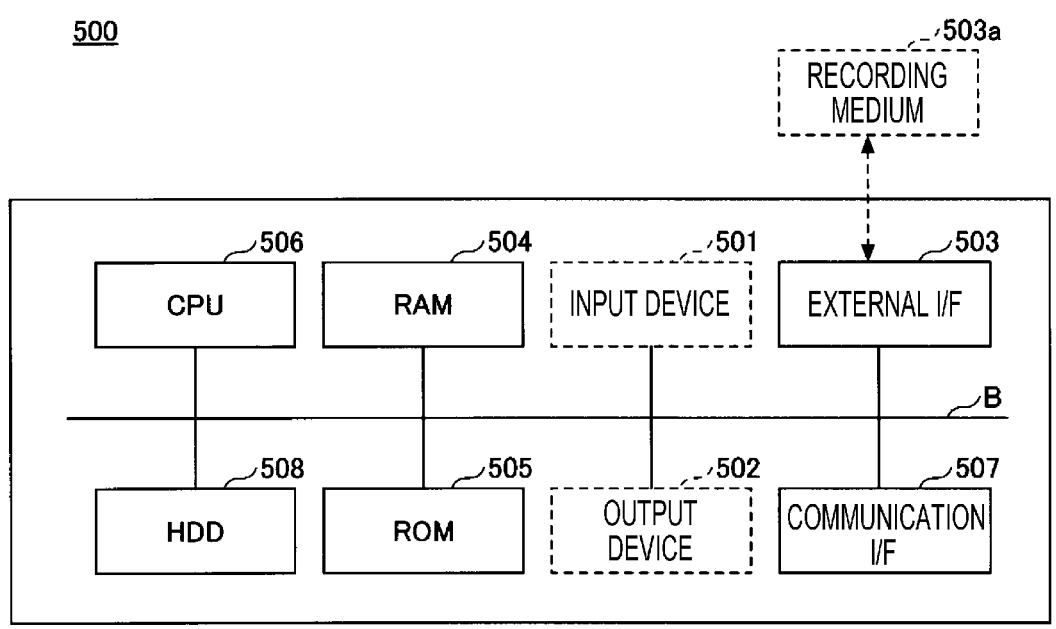
FIG. 2 is a hardware configuration diagram of an example of a computer.

The apparatus controller 12 and the server 20 of the information processing system 1 illustrated in FIG. 1 are implemented by, for example, a computer having a hardware configuration as illustrated in FIG. 2. FIG. 2 is a hardware configuration diagram of an example of a computer.

A computer 500 of FIG. 2 includes an input device 501, an output device 502, an external interface (I/F) 503, a random access memory (RAM) 504, a read only memory (ROM) 505, a central processing unit (CPU) 506, a communication I/F 507, and a hard disk drive (HDD) 508, and the respective elements are connected to each other via a bus B. The input device 501 and the output device 502 may be connected and used when necessary.

The input device 501 is a keyboard, a mouse, or a touch panel, and is used by an operator to input each operation signal. The output device 502 is, for example, a display, and displays the processing result by the computer 500. The communication I/F 507 is an interface for connecting the computer 500 to the network. The HDD 508 is an example of a non-volatile storage device that stores programs and data.

The external I/F 503 is an interface with an external device. The computer 500 may read and/or write to a recording medium 503a such as a secure digital (SD) memory card via the external I/F 503. The ROM 505 is an example of a non-volatile semiconductor memory (storage device) in which programs and data are stored. The RAM 504 is an example of a volatile semiconductor memory (storage device) that temporarily holds programs and data.

The CPU 506 is an arithmetic unit that implements control and functions of the entire computer 500 by reading a program or data from a storage device, such as the ROM 505 or the HDD 508, onto the RAM 504 and executing processing.

The apparatus controller 12 and the server 20 of FIG. 1 may implement various functions by the hardware configuration of the computer 500 of FIG. 2.

<Functional Configuration>

Figure 3:
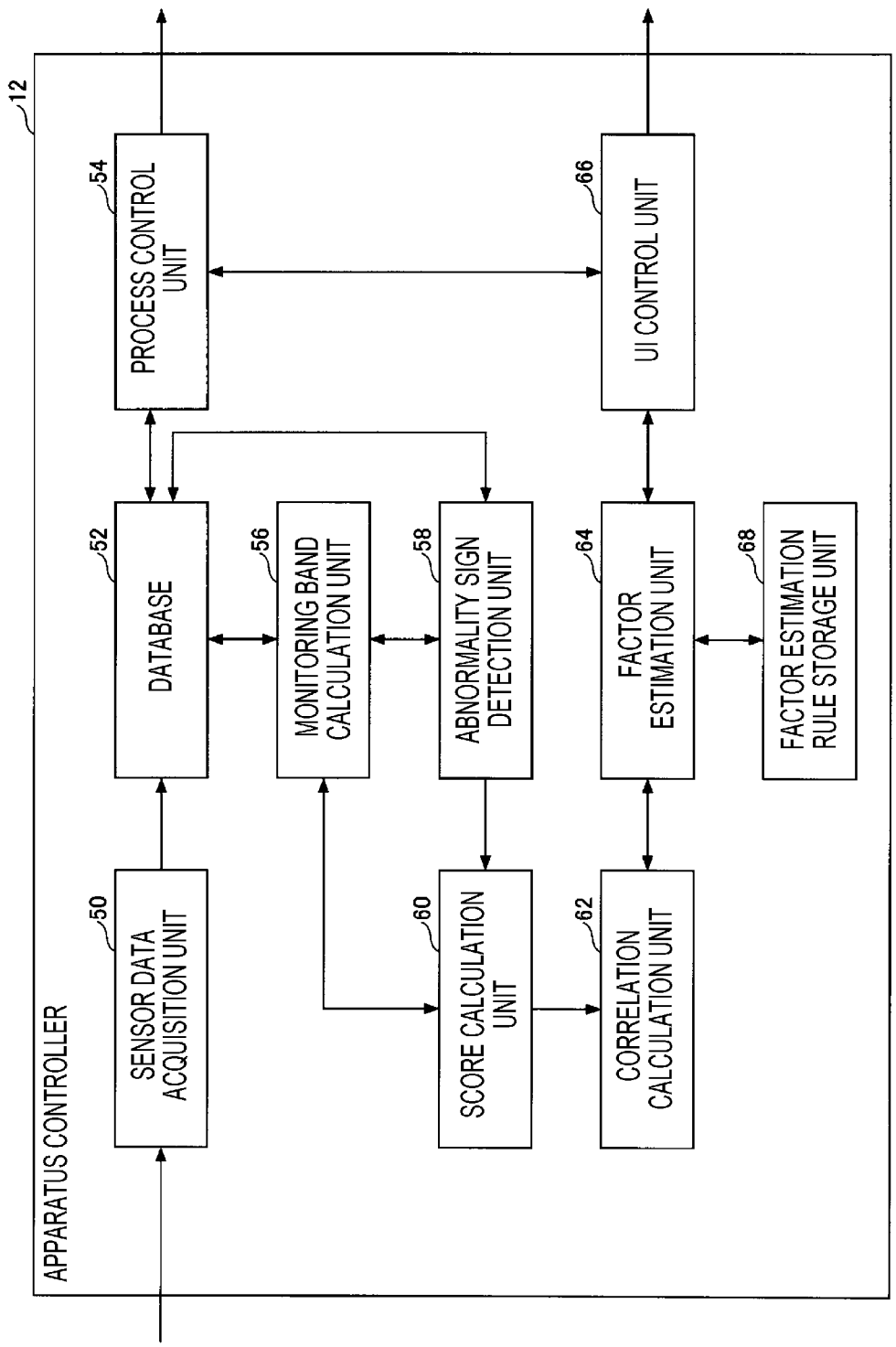
FIG. 3 is a functional block diagram of an example of an apparatus controller according to the present embodiment.

The apparatus controller 12 of the information processing system 1 according to the present embodiment is implemented by, for example, the functional block of FIG. 3. FIG. 3 is a functional block diagram of an example of the apparatus controller according to the present embodiment. Further, the functional block diagram of FIG. 3 omits the illustration of a configuration unnecessary for the description of the present embodiment. By executing the program for the apparatus controller 12, the apparatus controller 12 implements a sensor data acquisition unit 50, a database 52, a process control unit 54, a monitoring band calculation unit 56, an abnormality sign detection unit 58, a score calculation unit 60, a correlation calculation unit 62, a factor estimation unit 64, a UI control unit 66, and a factor estimation rule storage unit 68.

The sensor data acquisition unit 50 acquires the sensor waveform data (to be described later) measured by the sensor 11 while executing the process according to the process parameters, and stores such data in the database 52. The database 52 stores various types of data (e.g., sensor feature parameters such as a sensor resolution and a range of possible values) used in the waveform monitoring method in addition to the sensor waveform data described later.

The process control unit 54 outputs the process parameters for controlling the control components of the semiconductor manufacturing apparatus 10 to the semiconductor manufacturing apparatus 10 according to the recipe, thereby causing the semiconductor manufacturing apparatus 10 to execute the process according to the recipe.

The monitoring band calculation unit 56 calculates a monitoring band using the waveform monitoring method from the sensor waveform data in which the process is being executed according to the same recipe, as will be described later. The abnormality sign detection unit 58 monitors the waveform of the sensor waveform data using the monitoring band, and detects the abnormality sign of the semiconductor manufacturing apparatus 10 as described later.

The score calculation unit 60 calculates the monitoring result using the monitoring band for each combination of the sensor 11 and the step as a score (to be described later). The correlation calculation unit 62 calculates and learns the correlation of the score for each combination of the sensor 11 and the step in the normal state. Further, the correlation calculation unit 62 calculates the correlation of the score for each combination of the sensor 11 and the step when the abnormality sign of the semiconductor manufacturing apparatus 10 is detected.

The factor estimation unit 64 estimates the cause of the abnormality sign from a factor estimation rule (to be described later) based on a result of comparison between the correlation at the time of detecting the abnormality sign and the correlation at the normal time. The UI control unit 66 outputs information on the semiconductor manufacturing apparatus 10 such as the cause of the abnormality sign estimated by the factor estimation unit 64 to the output device 502, and notifies the operator of such information.

Further, the UI control unit 66 may display a screen on the output device 502 for receiving an instruction to the semiconductor manufacturing apparatus 10 from the operator, and may accept an instruction from the operator to the input device 501. The factor estimation rule storage unit 68 stores the factor estimation rule described later.

<Process>

The behavior of the semiconductor manufacturing apparatus 10 that executes the process according to the same recipe (controlled by the same recipe) is the same. Therefore, the semiconductor manufacturing apparatus 10 that is executing the process according to the same recipe theoretically has the same sensor waveform data of the sensor 11. In the present embodiment, for each sensor 11 mounted on the semiconductor manufacturing apparatus 10, a monitoring band used in the waveform monitoring method is calculated by using a statistically meaningful predetermined number (e.g., 15 to 25) as a parameter, and a monitoring using the monitoring band is performed. In the waveform monitoring method using the monitoring band, an abnormality sign is grasped from the behavior of the sensor waveform data of the sensor 11 to prevent troubles.

Figure 4:
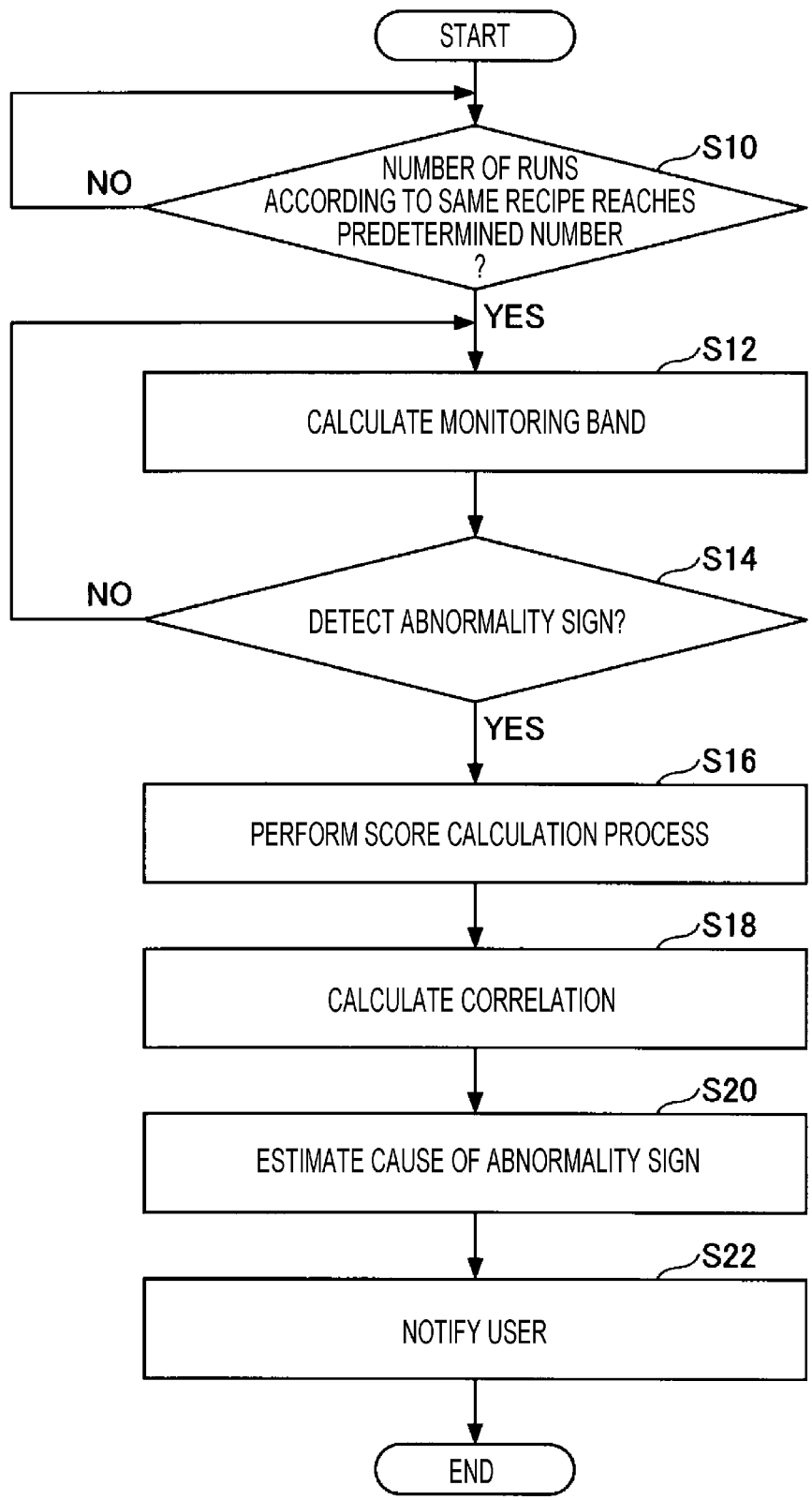
FIG. 4 is a flowchart of an example of processing of the apparatus controller according to the present embodiment.

FIG. 4 is a flowchart of an example of processing of the apparatus controller according to the present embodiment. The semiconductor manufacturing apparatus 10 executes a process according to a process parameter output from the apparatus controller 12. The sensor waveform data measured by the sensor 11 of the semiconductor manufacturing apparatus 10 that is executing the process is acquired by the sensor data acquisition unit 50 and stored in the database 52.

The apparatus controller 12 repeats the process of step S10 until the number of processes (runs) according to the same recipe reaches a statistically meaningful predetermined number. When the number of runs according to the same recipe reaches a statistically meaningful predetermined number, in step S12, the monitoring band calculation unit 56 of the apparatus controller 12 calculates the monitoring band.

Figure 5:
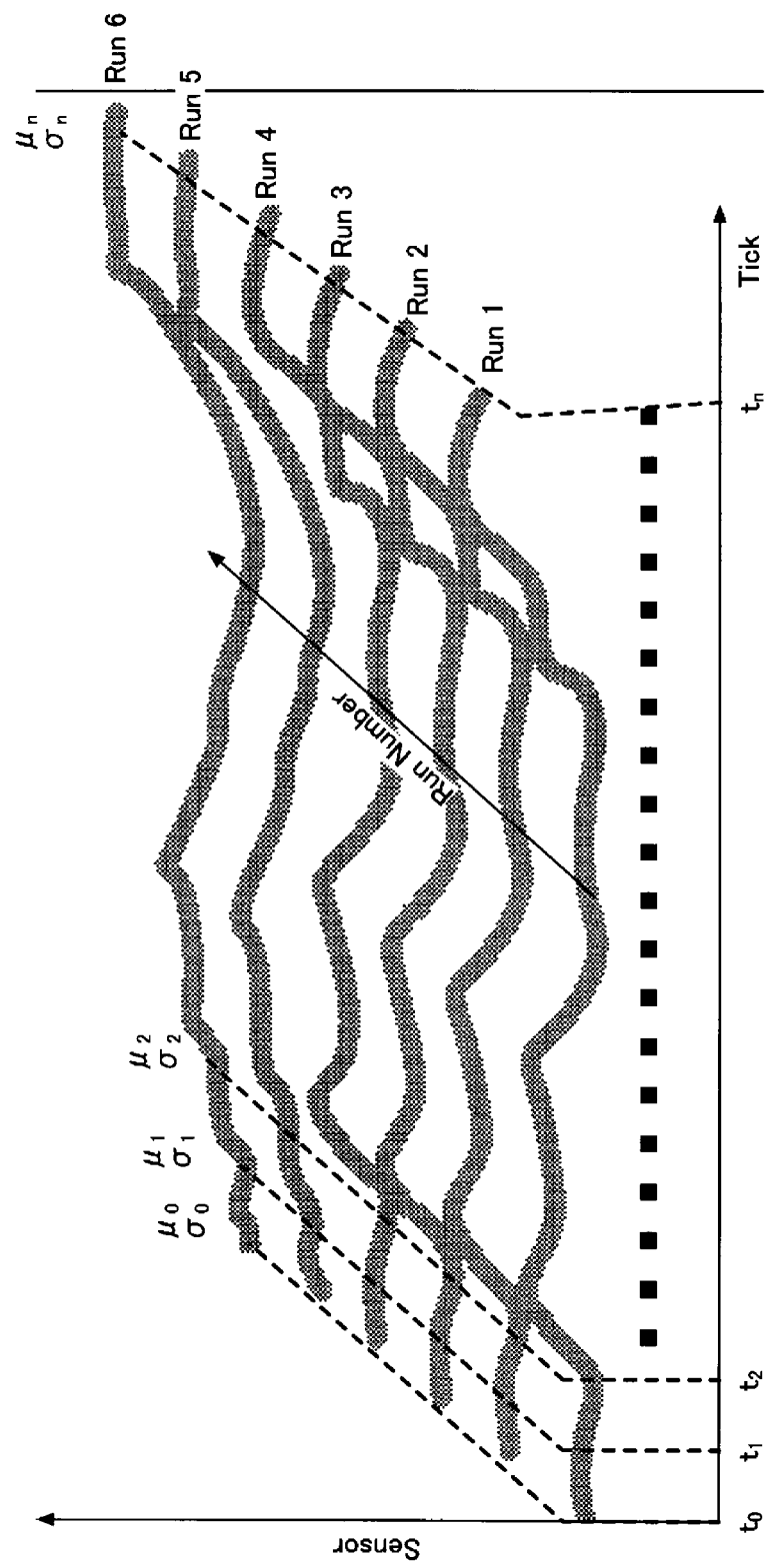
FIG. 5 is a diagram illustrating an example of sensor waveform data of a predetermined number of runs that is statistically meaningful.
Figure 6:
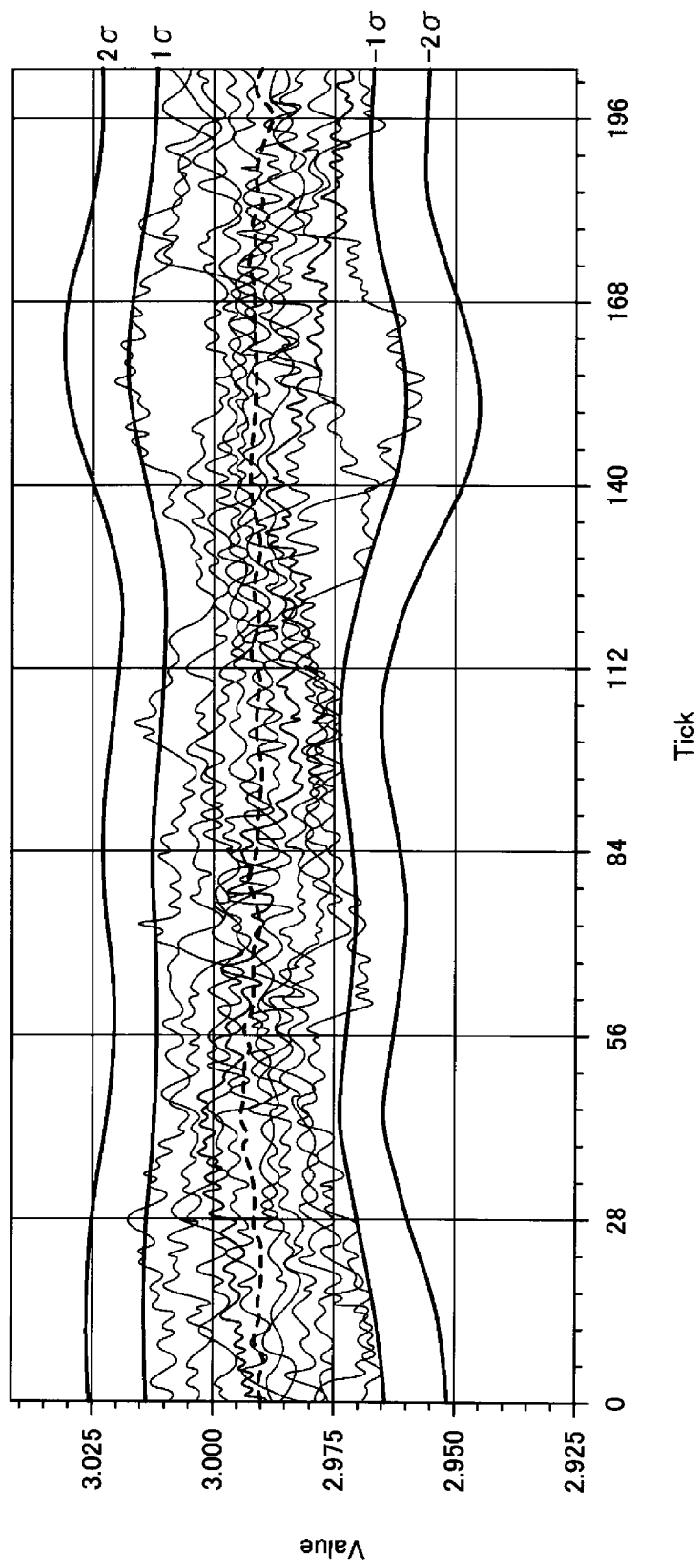
FIG. 6 is an image diagram of an example of a monitoring band calculated from sensor waveform data of a predetermined number of runs and the sensor waveform data.

FIG. 5 is a diagram illustrating an example of sensor waveform data of a predetermined number of runs that is statistically meaningful. In FIG. 5, the sensor waveform data for each run of a sensor 11 is visually represented. In FIG. 5, the vertical axis represents the sensor value, the horizontal axis represents the time, and the depth represents the run number that identifies the run. The monitoring band calculation unit 56 calculates the monitoring band as illustrated in FIG. 6 from the sensor waveform data of a predetermined number of runs as illustrated in FIG. 5. FIG. 6 is an image diagram of an example of a monitoring band calculated from sensor waveform data of a predetermined number of runs and the sensor waveform data. The monitoring band may be calculated by existing techniques using the mean and standard deviation. Further, sensor feature parameters may be used to calculate the monitoring band. For example, in the example of FIG. 6, the range indicated by the mean±standard deviation 1σ and 2σ is represented as an example of the monitoring band.

Figure 7A:
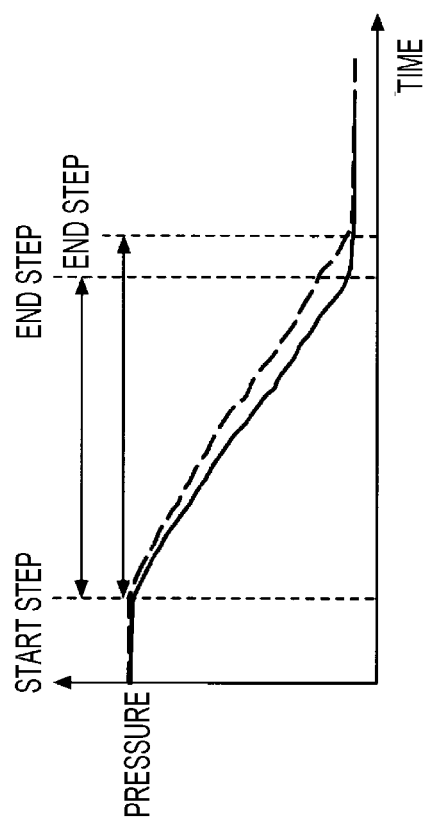
FIGS. 7A and 7B are diagrams illustrating an example of waveform monitoring of sensor waveform data.
Figure 7B:
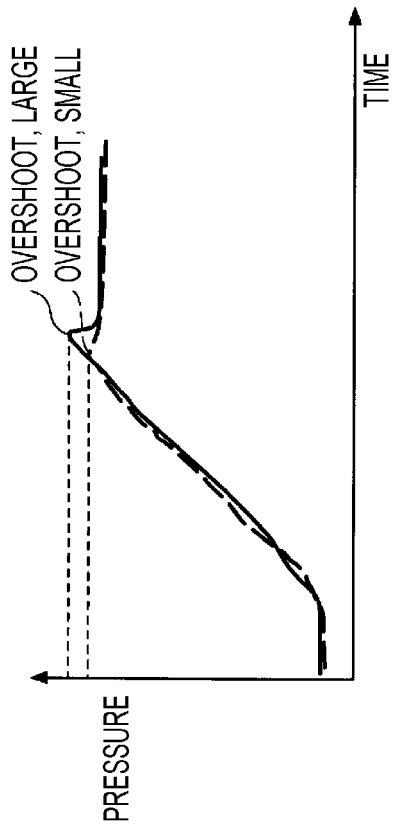

Waveform monitoring of sensor waveform data using a monitoring band will be further described. FIGS. 7A and 7B are diagrams illustrating an example of waveform monitoring of sensor waveform data. FIG. 7A is an example of sensor waveform data in which there is a difference in the Y-axis (pressure) direction. FIG. 7B is an example of sensor waveform data in which there is a difference in the X-axis (time) direction. For example, when trying to detect an abnormality sign by a difference in the sensor value from the normal value, it is possible to detect a difference in the sensor waveform data in the Y-axis (pressure) direction as illustrated in FIG. 7A, but it is not possible to detect a difference in the sensor waveform data in the X-axis (time) direction as illustrated in FIG. 7B.

The semiconductor manufacturing apparatus 10 includes a control unit called a plurality of steps according to a recipe, and the step time differs depending on the transition condition from one step to the next step. For example, in the case of the step of "waits until a certain pressure is reached," the time fluctuates due to the influence of various external factors such as the gas supply system, the exhaust system, and the atmospheric pressure. Even when the time is as small as a few seconds to a dozen seconds, since the effect of multiple factors on product quality may not be ignored, the information processing system 1 according to the present embodiment enables the detection of a difference in sensor waveform data in the X-axis (time) direction. As a result, in the information processing system 1 according to the present embodiment, the difference in the sensor waveform data in the X-axis (time) direction may be grasped as an abnormality sign and notified to the worker.

Figure 8A:
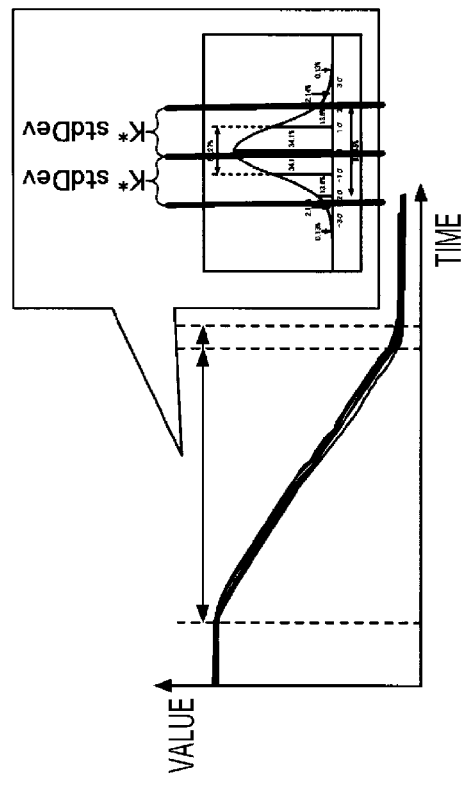
FIGS. 8A and 8B are diagrams illustrating an example of waveform monitoring of sensor waveform data using a monitoring band.
Figure 8B:
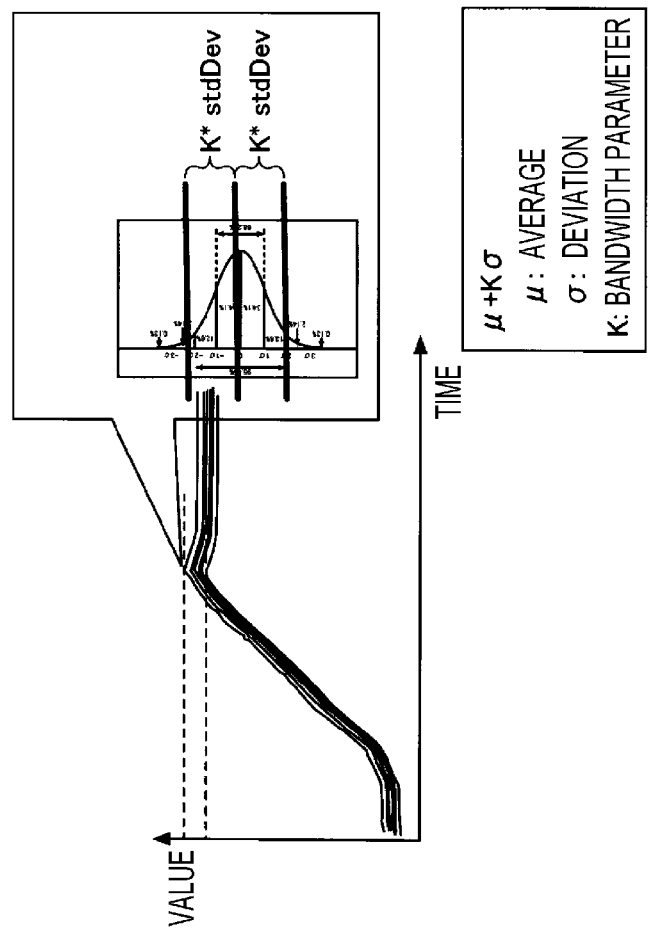

FIGS. 8A and 8B are diagrams illustrating an example of waveform monitoring of sensor waveform data using the monitoring band. FIG. 8A is an example of waveform monitoring in the Y-axis direction. FIG. 8A represents an example of calculating a monitoring band using the average of sensor values at a moment, deviation (dispersion degree), and sensor feature parameters of the sensor 11 with respect to the Y axis.

FIG. 8B is an example of waveform monitoring in the X-axis direction. FIG. 8B represents calculating the monitoring band for the step time length with respect to the X axis. Specifically, FIG. 8B represents an example of collecting the actual results of the step time lengths of the same recipe for a predetermined number, and calculating the monitoring band using the average, the deviation, and the sensor feature parameters of the sensor 11. As illustrated in FIG. 8B, when the monitoring band for the step time length is used, it becomes possible to detect not only the case where the step time becomes longer and the monitoring band is removed, but also the case where the step time becomes shorter and the monitoring band is removed.

By referring back to FIG. 4, in step S14, the abnormality sign detection unit 58 detects the abnormality sign of the semiconductor manufacturing apparatus 10 when the sensor waveform data that monitors waveform deviates from each monitoring band for the X axis or the Y axis. When the abnormality sign of the semiconductor manufacturing apparatus 10 is detected, the score calculation unit 60 proceeds to step S16 and performs the score calculation process. In the score calculation process, the score calculation unit 60 calculates the monitoring result using the monitoring band as a score for each combination of the sensor 11 and the step.

FIGS. 9A and 9B are image diagrams of an example of a score for each combination of the sensor and the step. In FIGS. 9A and 9B, as an example of the score, the degree of divergence from the monitoring band is represented for each combination of the sensor 11 and the step.

FIG. 9A illustrates the degree of divergence for each combination of the sensor 11 of a predetermined number of runs and the step in the normal time (normal range time). In the example of FIG. 9A, one table represents one run. For example, "0.35" described in the upper left column of the frontmost table in FIG. 9A indicates the degree of divergence in step "1" of the sensor "A." The degree of divergence for each combination of the sensor 11 for a predetermined number of runs and the step as illustrated in FIG. 9A may be learned in advance at normal times, not after detecting an abnormality sign of the semiconductor manufacturing apparatus 10 in step S14.

FIG. 9B illustrates the degree of divergence for each combination of the run sensor 11 and the step when the abnormality sign of the semiconductor manufacturing apparatus 10 is detected (when the normal range deviates). The example of FIG. 9B is an example in which the divergence degree "5.72" in the step "3" of the sensor "B" is out of the monitoring band.

Figure 10:
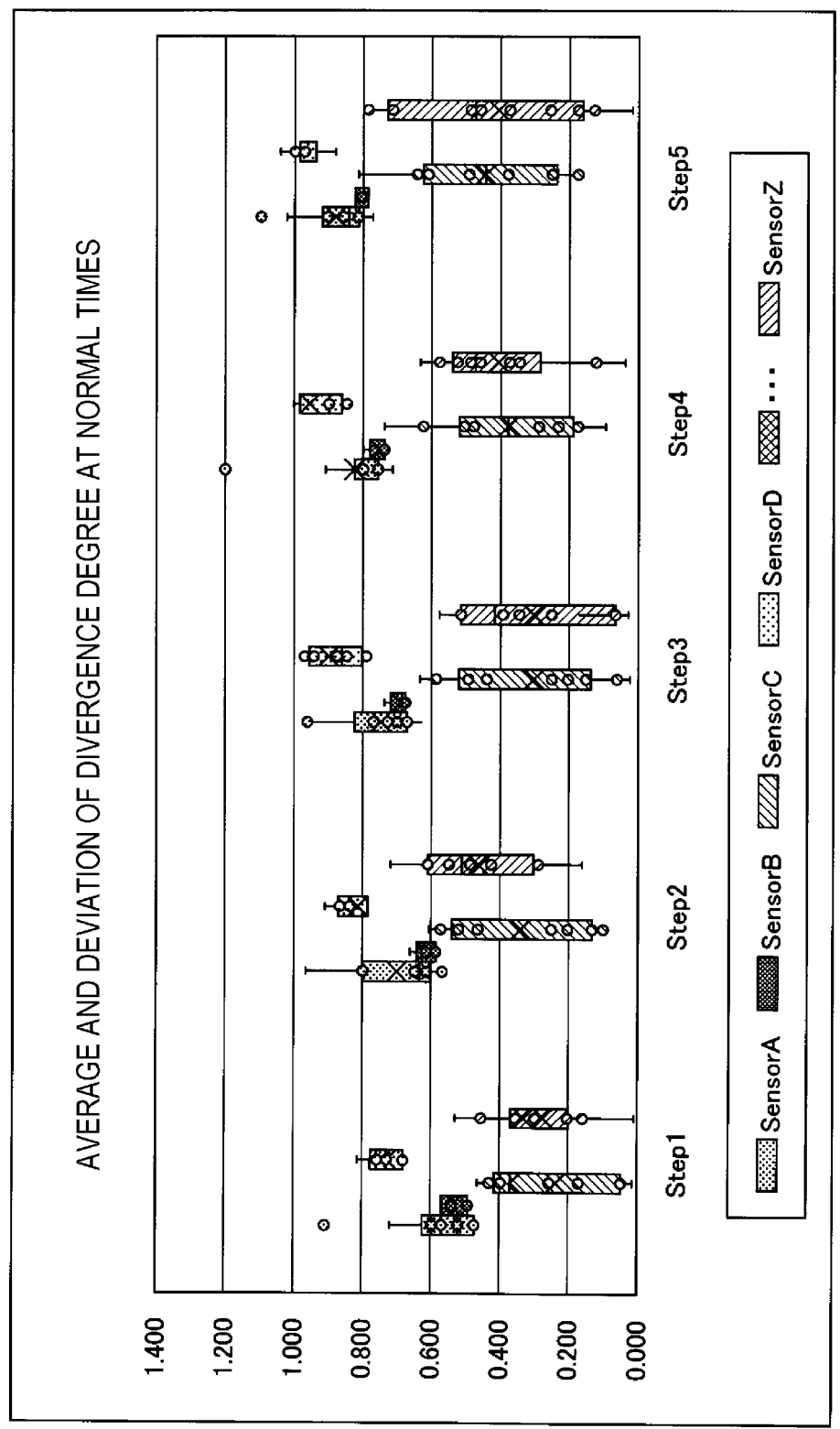
FIG. 10 is a diagram illustrating an example of the average and variation of the degree of divergence in a normal state.

Further, the correlation calculation unit 62 calculates the average of the divergence degrees for each sensor 11 and each step as illustrated in, for example, FIG. 10, and the standard deviation from the degree of divergence for each combination of the sensor 11 for a predetermined number of runs and the step in the normal time as illustrated in FIG. 9A. FIG. 10 is a diagram illustrating an example of the average and deviation of the degree of divergence in the normal time. For example, FIG. 10 illustrates an example in which the degree of divergence for the number of runs (e.g., 20) is plotted for each of the sensor 11 and the step. The correlation calculation unit 62 calculates a correlation coefficient representing the correlation between the sensors 11 as illustrated in, for example, FIG. 11 from the average of the divergence degree for each sensor 11 and each step as illustrated in FIG. 10 and the standard deviation. FIG. 11 is an image diagram of an example of a correlation coefficient between sensors. For example, the table of FIG. 11 represents that the sensor "B" is correlated with the sensor "D" and then with the sensor "A." The correlation calculation unit 62 keeps the sensors 11 having a correlation coefficient within a certain range from the table as illustrated in FIG. 11 in a list as those having a strong relationship. It is desirable to learn the retention of such a list in advance at normal times.

When an abnormality sign of the semiconductor manufacturing apparatus 10 is detected in step S14, in step S18, the correlation calculation unit 62 calculates a difference between the latest degree of divergence between the sensor 11 that has detected an abnormality sign (hereinafter, referred to as a target sensor) and the sensor 11 that has a strong correlation at normal times, and the average degree of divergence during learning.

Further, the correlation calculation unit 62 calculates the latest correlation coefficient between the target sensor and the sensor 11 which has a strong correlation with the target sensor at normal times. Then, the correlation calculation unit 62 calculates the difference between the normal time and the time when the abnormality sign is detected with respect to the correlation coefficient between the target sensor and the sensor 11 which has a strong correlation at normal times.

The correlation calculation unit 62 converts the difference between the latest degree of divergence between the target sensor and the sensor 11, which has a strong correlation at normal times, and the average degree of divergence during learning, and the difference in the correlation coefficient between the target sensor and the sensor 11, which has a strong correlation at normal times, between the normal time and the time when the abnormality sign is detected into a contribution rate by a predetermined algorithm. As for a predetermined algorithm for converting into the contribution rate, it is possible to use an existing algorithm that may convert the combination of the sensor 11 and the step, which are highly related to the behavior of the target sensor, into a value that is estimable.

The correlation calculation unit 62 creates information on the combination of the sensor 11 and the step, which are presumed to be highly related to the behavior of the target sensor, as illustrated in, for example, the lower right table of FIG. 9B according to the calculated contribution rate. Information on the combination of the sensor 11 and the step, which are presumed to be highly related to the behavior of the target sensor, may be displayed in a ranking.

In the example of FIG. 9B, since the abnormality sign which is the "unusual state" is detected in the step "3" of the sensor "B," the difference in the degree of divergence between the sensor "D" and the sensor "A," which have a strong correlation with the sensor "B," from the normal time is confirmed. Also, it is confirmed from the difference between the current run and the correlation coefficient during learning, which has the next problem, that the relationship has changed significantly.

The contents confirmed as described above may be appropriately weighted and used in a predetermined algorithm for converting into the above-mentioned contribution rate.

Figure 12:
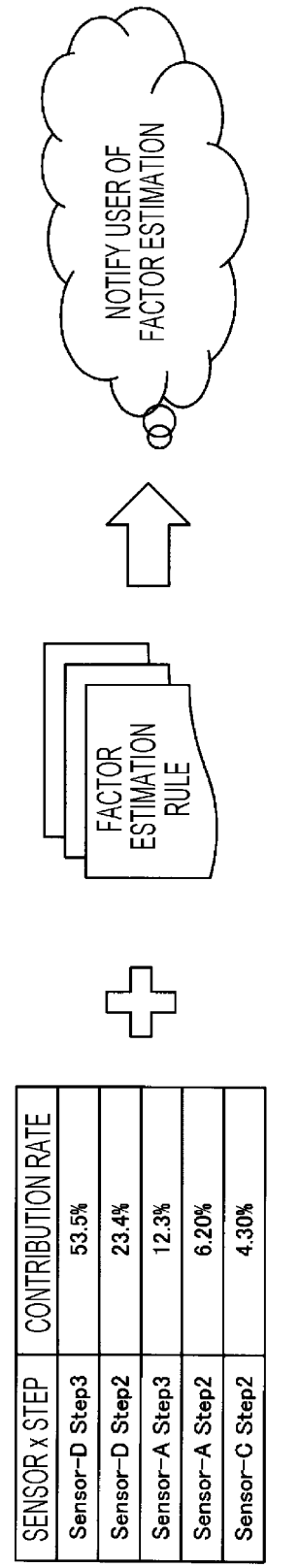
FIG. 12 is a diagram illustrating the estimation of the cause of an abnormality sign.

Proceeding to step S20, the factor estimation unit 64 estimates the cause of the abnormality sign as illustrated in, for example, FIG. 12. FIG. 12 is a diagram illustrating the estimation of the cause of the abnormality sign. The factor estimation unit 64 combines information on the combination of the sensor 11 and the step (see the table on the right side of FIG. 12), which are presumed to be highly related to the behavior of the target sensor created in step S18, and the factor estimation rule stored in the factor estimation rule storage unit 68, and estimates the cause of the abnormality sign.

The factor estimation rule is a rule created from design and operational knowledge. Here, an example of the factor estimation rule will be described. The processing system in the semiconductor manufacturing apparatus 10 is divided into, for example, a temperature control system, a gas control system, and a pressure control system. The sensor value of the sensor 11 installed in each part is affected by the state of each processing system. The factor estimation rule is a rule for isolating the cause estimated when the temperature or pressure behaves differently from the normal time based on the know-how of design or experiment. For example, there are the following Examples 1 to 3.

Example 1

When a flow rate decrease is observed in a flow meter, a decrease in the heater temperature of the target gas line is also observed at the same time.→It is presumed that the cause is the decrease in the gas line resistance value due to insufficient gas line heating.

Example 2

When a flow rate decrease is observed in a flow meter, variation in opening/closing timing of valve A of the target gas line is also observed at the same time.→It is presumed that the cause is the failure of the valve A.

Example 3

The temperature rise of the exhaust pump is seen from the previous step when the chamber evacuation time is longer than usual.→It is presumed that the cause is an abnormality in the exhaust pump.

Proceeding to step S22, the UI control unit 66 outputs the cause of the abnormality sign estimated by the factor estimation unit 64 to the output device 502, and notifies the operator (user) of such a cause. The notification to the user may be performed by a graphical user interface (GUI) mounted on the semiconductor manufacturing apparatus 10, a terminal connected to be able to communicate via the network 30, or a host computer.

In the information processing system 1 of the present embodiment, the factor estimation rule is mounted on the semiconductor manufacturing apparatus 10 in advance, and the factor of the abnormality sign is estimated to notify to the operator. In the initial phase, a plurality of factors of the abnormality sign may be presented at the same time and the operator may select the factors, and the estimation accuracy of the cause of the abnormality may be improved while receiving feedback. Further, the factor estimation rule does not necessarily have to be mounted on the semiconductor manufacturing apparatus 10 in advance, and may be stored in an apparatus capable of communicating with the apparatus controller 12 of the semiconductor manufacturing apparatus 10 via the network 30.

Up to this point, an example has been explained in which, in each semiconductor manufacturing apparatus 10, a monitoring band is calculated from an example of sensor waveform data of a predetermined number of statistically meaningful runs, and waveform monitoring of the sensor waveform data is performed using the monitoring band.

In the information processing system 1 according to the present embodiment, for example, when there is a mechanism for communicating between the semiconductor manufacturing apparatuses 10, it is possible to implement an analysis function of a machine difference between the semiconductor manufacturing apparatuses 10 by comparing the scores for each combination of the sensor 11 and the step of the other semiconductor manufacturing apparatuses 10.

Figure 13:
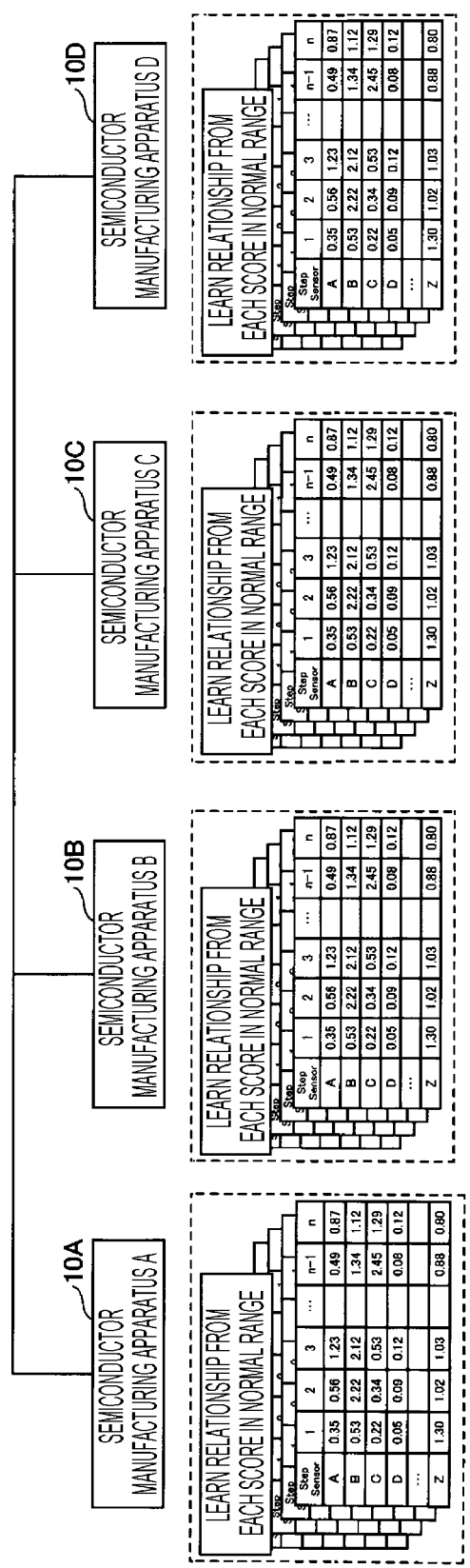
FIG. 13 is a diagram illustrating an example of a machine difference analysis function of a semiconductor manufacturing apparatus.

FIG. 13 is a diagram illustrating an example of a machine difference analysis function of the semiconductor manufacturing apparatus. In FIG. 13, it is assumed that four semiconductor manufacturing apparatuses 10A to 10D are executing the same recipe. The semiconductor manufacturing apparatuses 10A to 10D of FIG. 13 may detect a difference from the usual time from the overall viewpoint of the semiconductor manufacturing apparatuses 10A to 10D executing the same recipe by comparing the score for each combination of the sensor 11 and the step of the own machine with the score for each combination of the sensor 11 and the step of the other semiconductor manufacturing apparatus 10. Further, the semiconductor manufacturing apparatuses 10A to 10D of FIG. 13 may detect a difference from the usual one in consideration of the machine difference.

Although the preferred examples of the present disclosure have been described in detail above, the present disclosure is not limited to the above-mentioned examples, and various modifications and substitutions may be made to the above-described examples without departing from the scope of the present disclosure. For example, at least a part of the functions of the apparatus controller 12 illustrated in the present embodiment may be provided in the server 20.

According to the present disclosure, it is possible to detect an abnormality sign in a semiconductor manufacturing apparatus.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An information processing apparatus comprising:
a memory;
and a processor, wherein the processor, when executing program instructions stored in the memory, is configured to perform:
a sensor data collecting operation to acquire sensor waveform data represented with respect to a sensor value axis and a time axis, measured by sensors in a plurality of semiconductor manufacturing apparatuses each of which executing processes according to a same recipe;
a monitoring band calculating operation to calculate each monitoring band for the sensor waveform data represented with respect to the sensor value axis and the time axis used in a waveform monitoring method from a predetermined number or more of the sensor waveform data;
an abnormality sign detecting operation to monitor a waveform of the sensor waveform data using each monitoring band for the sensor waveform data represented with respect to the sensor value axis and the time axis and detect an abnormality sign of the semiconductor manufacturing apparatus;
a score calculating operation to calculate a result of monitoring a waveform of the sensor waveform data using the monitoring band for the sensor waveform data as a score for each sensor and each processing step;
a correlation calculating operation to:
identify a target sensor showing abnormality and its corresponding processing step as a target pair based on the abnormality sign detection;
calculate correlation coefficients between scores of each combined pair of the sensors and the processing steps from the scores for both normal and abnormal time;
calculate a contribution rate for each combined pair based on:
(i) a difference between a latest degree of divergence and an average degree of divergence during learning, and
(ii) a difference between correlation coefficients at normal time and at abnormal time;
create a contribution rate table on combinations of sensors and processing steps that are highly related to behavior of the target sensor based on the calculated contribution rates;
a factor estimating operation to combine (i) the contribution rate table with (ii) a factor estimation rule stored in a factor estimation rule storage to estimate a cause of the abnormality sign;
and a notification operation to notify a user of the cause.

2. The information processing apparatus according to claim 1, wherein, when detecting a combination in which the result of monitoring the waveform of the sensor waveform data using the monitoring band for the sensor waveform data is different from a normal state, the factor estimating operation estimates a combination that is highly related to the combination that is different from the detected normal state based on a difference between a score at a normal time and a score at a time of detecting the abnormality sign by the abnormality sign detecting operation.

3. The information processing apparatus according to claim 2, wherein, when detecting a combination in which the result of monitoring the waveform of the sensor waveform data using the monitoring band for the sensor waveform data is different from a normal state, the factor estimating operation estimates a combination that is highly related to the combination that is different from the detected normal state based on a difference between the correlation at the normal time and the correlation at the time of detecting the abnormality sign.

4. The information processing apparatus according to claim 3, wherein the sensor data collecting operation acquires the sensor waveform data measured by the plurality of semiconductor manufacturing apparatuses that are executing the process according to the same recipe, and
the monitoring band calculating operation calculates the monitoring band for the sensor waveform data from the sensor waveform data of a predetermined number or more of the plurality of semiconductor manufacturing apparatuses.

5. The information processing apparatus according to claim 4, wherein, during the sensor data collecting operation, communication with a plurality of other semiconductor manufacturing apparatuses connected through a network is enabled, and the sensor waveform data measured by the other plurality of semiconductor manufacturing apparatuses that are executing the process according to the same recipe is acquired, and
the monitoring band calculating operation calculates the monitoring band for the sensor waveform data from the sensor waveform data of a predetermined number or more of the other plurality of semiconductor manufacturing apparatuses in consideration of a machine difference.

6. The information processing apparatus according to claim 1, wherein the monitoring band calculating operation calculates the monitoring band for the sensor waveform data from an average of time spent on the processing step and a degree of dispersion for each of the plurality of processing steps according to the recipe.

7. The information processing apparatus according to claim 1, wherein the sensor data collecting operation acquires the sensor waveform data measured by a plurality of semiconductor manufacturing apparatuses that are executing the process according to the same recipe, and
the monitoring band calculating operation calculates the monitoring band for the sensor waveform data obtained from the plurality of semiconductor manufacturing apparatuses.

8. The information processing apparatus according to claim 7, wherein, during the sensor data collecting operation communication with a plurality of other semiconductor manufacturing apparatuses connected through a network is enabled, and the sensor waveform data measured by the other plurality of semiconductor manufacturing apparatuses that are executing the process according to the same recipe is acquired, and
the monitoring band calculating operation calculates the monitoring band of the sensor waveform data obtained from the other plurality of semiconductor manufacturing apparatuses in consideration of a machine difference.

9. A non-transitory computer-readable recording medium having stored therein a program that causes an information processing apparatus to execute a process comprising:
acquiring sensor waveform data represented with respect to a sensor value axis and a time axis, measured by a semiconductor manufacturing apparatus that is executing a process according to a same recipe;
calculating a monitoring band for the sensor waveform data represented with respect to the sensor value axis and the time axis used in a waveform monitoring method from a predetermined number or more of the sensor waveform data;
monitoring a waveform of the sensor waveform data using the monitoring band for the sensor waveform data represented with respect to the sensor value axis and the time axis and detect an abnormality sign of the semiconductor manufacturing apparatus;
calculating a result of monitoring a waveform of the sensor waveform data using the monitoring band for the sensor waveform data as a score for a sensor and a processing step;
identifying a target sensor showing abnormality and its corresponding processing step as a target pair based on the abnormality sign detection;
calculating correlation coefficients between scores of each combined pair of the sensors and the processing steps for both normal and abnormal time;
calculating a contribution rate for each combined pair based on:
(i) a difference between a latest degree of divergence and an average degree of divergence during learning, and
(ii) a difference between correlation coefficients at normal time and at abnormal time;
creating a contribution rate table on combinations of sensors and processing steps that are highly related to behavior of the target sensor based on the calculated contribution rates;
estimating a cause of the abnormality sign from a factor estimation rule of the cause of the abnormality sign by combining (i) the contribution rate table with (ii) a factor estimation rule stored in a factor estimation rule storage;
and notifying a user of the cause.

10. A monitoring method executed by an information processing apparatus, the method comprising:
acquiring sensor waveform data represented with respect to a sensor value axis and a time axis, measured by a semiconductor manufacturing apparatus that is executing a process according to a same recipe;
calculating a monitoring band for the sensor waveform data represented with respect to the sensor value axis and the time axis used in a waveform monitoring method from a predetermined number or more of the sensor waveform data;
monitoring a waveform of the sensor waveform data using the monitoring band for the sensor waveform data represented with respect to the sensor value axis and the time axis and detecting an abnormality sign of the semiconductor manufacturing apparatus;
calculating a result of monitoring a waveform of the sensor waveform data using the monitoring band for the sensor waveform data as a score for a sensor and a processing step;
identifying a target sensor showing abnormality and its corresponding processing step as a target pair based on the abnormality sign detection;
calculating correlation coefficients between scores of each combined pair of the sensors and the processing steps from the score for both normal and abnormal time;
calculating a contribution rate for each combined pair based on:
(i) a difference between a latest degree of divergence and an average degree of divergence during learning, and
(ii) a difference between correlation coefficients at normal time and at abnormal time;

creating a contribution rate table on combinations of sensors and processing steps that are highly related to behavior of the target sensor based on the calculated contribution rates;

estimating a cause of the abnormality sign from a factor estimation rule of the cause of the abnormality sign by combining (i) the contribution rate table with (ii) a factor estimation rule stored in a factor estimation rule storage;

and notifying a user of the cause.

* * * * *